US011444100B2

(12) United States Patent
Kim et al.

(10) Patent No.: US 11,444,100 B2
(45) Date of Patent: Sep. 13, 2022

(54) VERTICAL MEMORY DEVICE WITH TRI-LAYER CHANNEL

(71) Applicant: Industry-University Cooperation Foundation Hanyang University, Seoul (KR)

(72) Inventors: Tae Whan Kim, Seoul (KR); Jun Gyu Lee, Seoul (KR); Hyun Soo Jung, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 99 days.

(21) Appl. No.: 16/957,579

(22) PCT Filed: Nov. 19, 2018

(86) PCT No.: PCT/KR2018/014191
§ 371 (c)(1),
(2) Date: Jun. 24, 2020

(87) PCT Pub. No.: WO2019/235701
PCT Pub. Date: Dec. 12, 2019

(65) Prior Publication Data
US 2020/0328229 A1 Oct. 15, 2020

(30) Foreign Application Priority Data
Jun. 8, 2018 (KR) .......................... 10-2018-0065885

(51) Int. Cl.
*H01L 27/11582* (2017.01)
*H01L 27/11556* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC ......................................... H01L 27/115–11597
See application file for complete search history.

(56) References Cited

U.S. PATENT DOCUMENTS 9,236,394 B2 * 1/2016 Rhie .................. G11C 16/0408
10,777,566 B2 * 9/2020 Lue .......................... G11C 11/54
(Continued)

FOREIGN PATENT DOCUMENTS

KR 10-2010-0133558 A 12/2010
KR 10-2011-0119454 A 11/2011
(Continued)

*Primary Examiner* — Stephen M Bradley
*Assistant Examiner* — Gustavo G Ramallo
(74) *Attorney, Agent, or Firm* — Novick, Kim & Lee, PLLC; Jae Youn Kim (57) ABSTRACT

A vertical memory device and a method of fabricating the same are proposed. The vertical memory device includes a gate stack structure in which gates and interlayer insulating layers for insulating the gates are alternately laminated on a substrate and multiple memory cell areas and inter-memory cell areas are divided in a first direction perpendicular to the substrate; a channel structure extending in the first direction from the substrate to penetrate the gate stack structure; and charge storage elements disposed between the gate stack structure and the channel structure and sequentially formed to be embedded in the gate stack structure.

16 Claims, 8 Drawing Sheets

(56) References Cited

U.S. PATENT DOCUMENTS

| | | | |
|---|---|---|---|
| 2011/0260237 A1* | 10/2011 | Lee | ................ H01L 29/792 |
| | | | 257/325 |
| 2013/0069152 A1* | 3/2013 | Lee | ............. G11C 16/0483 |
| | | | 257/E29.256 |
| 2015/0056797 A1 | 2/2015 | Ahn et al. | |
| 2018/0151588 A1 | 5/2018 | Kajiwara et al. | |
| 2019/0280005 A1* | 9/2019 | Bin | ............. H01L 27/11582 |
| 2021/0288067 A1* | 9/2021 | Kanamori | ......... H01L 27/11519 |

FOREIGN PATENT DOCUMENTS

| | | |
|---|---|---|
| KR | 10-2013-0086778 A | 8/2013 |
| KR | 10-2013-0116116 A | 10/2013 |
| KR | 10-2015-0114102 A | 10/2015 |
| KR | 10-2016-0060850 A | 5/2016 |
| KR | 10-2017-0088108 A | 8/2017 |
| KR | 10-2017-0142774 A | 12/2017 |
| KR | 10-2019-0002370 A | 1/2019 |

* cited by examiner

VERTICAL MEMORY DEVICE WITH TRI-LAYER CHANNEL

CROSS-REFERENCE TO RELATED APPLICATIONS

This application is a National Stage Entry of PCT International Application No. PCT/KR2018/014191, which was filed on Nov. 19, 2018, and which claims priority to Korean Patent Application No. 10-2018-0065885, filed on Jun. 8, 2018 in the Korean Intellectual Property Office, the disclosure of which is incorporated herein by reference.

TECHNICAL FIELD

The present invention relates to a resistive random access memory (ReRAM) provided with a vertical memory device and a method of fabricating the vertical memory device. More specifically, the present invention relates to a vertical memory device capable of reducing the read threshold voltage ($V_{th.read}$) of a flash memory (NAND flash memory) and reducing random telegraph noise (RTN) due to trapping and a method of fabricating the vertical memory device.

BACKGROUND ART

To achieve excellent performance and low price required by consumers, the degree of integration of semiconductor devices needs to be increased. In particular, in the case of semiconductor devices, the degree of integration thereof is considered an important factor in determining product price. Accordingly, it is an important requirement to increase the degree of integration when fabricating semiconductor devices. In the case of conventional two-dimensional or planar semiconductor devices, the degree of integration thereof is mainly determined by an area occupied by unit memory cells. Accordingly, the degree of integration of the conventional semiconductor devices is significantly influenced by the level of fine pattern formation technology. However, to form fine patterns, very expensive equipment is required. Due to this problem, there is a limit to increase in the degree of integration of two-dimensional semiconductor devices.

To overcome these limitations, three-dimensional semiconductor devices having three-dimensionally arranged memory cells have been proposed.

More specifically, to implement high area density and low power consumption, conventional two-dimensional (2D) planar flash memory devices should be subjected to a scale-down process. However, there are problems such as inter-cell interference, decrease in the number of accumulated charges in a nitride layer, and a difficult patterning process. To overcome these problems, research on 3D NAND flash technology is underway.

Compared to conventional 2D NAND flash memory, 3D NAND flash memory devices may greatly reduce inter-cell interference. In addition, since memory cells are laminated vertically, cell capacity may be increased.

In a 3D NAND flash memory, since a polysilicon channel is used instead of a silicon channel, the electrical properties of the 3D NAND flash memory may be changed due to grain boundary (GB) traps. Thus, to minimize change in the electrical properties, a macaroni-type device including a cylindrical channel, the inside of which is filled with an oxide layer, has been proposed. In the case of the macaroni-type device, the area of a polysilicon channel is reduced, and thus, fluctuation in electrical properties due to grain boundary (GB) traps present at the channel is reduced.

In addition, decrease in reliability due to grain boundary traps, interface traps, and tunnel oxide traps exhibited in triple-level-cell (TLC) devices or multi-level-cell (MLC) devices is considered a very important issue in terms of the lifespan of a device.

DISCLOSURE

Technical Problem

Therefore, the present invention has been made in view of the above problems, and it is one object of the present invention to provide a vertical memory device. In the vertical memory device according to the present invention, an n-type doped buried channel area and a p-type doped barrier area are formed by performing first ion implantation and second ion implantation on channel layers. Accordingly, the read threshold voltage ($V_{th.read}$) of a flash memory (NAND flash memory) may be reduced, thereby increasing power consumption efficiency. In addition, performance degradation by random telegraph noise (RTN) due to grain boundary traps, interface traps, and tunnel oxide traps may be minimized, thereby improving the reliability of the vertical memory device.

It is another object of the present invention to provide a vertical memory device. In the vertical memory device of the present invention, first ion implantation is performed on channel layers to form an n-type doped buried channel area, thereby increasing the on-current level of the vertical memory device and decreasing a pass voltage ($V_{pass}$) required during a word line read operation. Accordingly, the power consumption efficiency of the vertical memory device may be improved.

It is still another object of the present invention to provide a vertical memory device. According to the present invention, second ion implantation is performed on channel layers to form a p-type doped barrier area. Thus, the transferable distance of electrons in traps may be increased through Frenkel-Poole tunneling, which is the main conduction mechanism of random telegraph noise (RTN). Thereby, in the vertical memory device, effects due to traps may be reduced.

It is still another object of the present invention to provide a vertical memory device. According to the present invention, in the vertical memory device, an n-type doped buried channel area is formed to be embedded between an undoped channel area and a p-type doped barrier area, thereby minimizing degradation in device performance (e.g., low-current level or current fluctuation) due to grain boundary (GB) traps present in channels.

It is still another object of the present invention to provide a vertical memory device. According to the present invention, in the vertical memory device, a buried channel is formed by repeating an ion implantation process, thereby reducing traps (interface traps) generated by non-uniformity between an undoped channel area and a tunnel oxide film.

It is yet another object of the present invention to provide a vertical memory device. According to the present invention, in the vertical memory device, a channel structure in a multilayer form is formed. Thus, when a program/erase process is repeated, the effect of tunnel oxide traps generated in a tunnel oxide film may be reduced and read failure due to random telegraph noise may be prevented, thereby improving the reliability of the vertical memory device.

Technical Solution

In accordance with one aspect of the present invention, provided is a vertical memory device including a gate stack structure in which gates and interlayer insulating layers for insulating the gates are alternately laminated on a substrate and multiple memory cell areas and inter-memory cell areas are divided in a first direction perpendicular to the substrate; a channel structure extending in the first direction from the substrate to penetrate the gate stack structure; and charge storage elements disposed between the gate stack structure and the channel structure and sequentially formed to be embedded in the gate stack structure, wherein the channel structure includes an insulating pillar formed at a center thereof and channel layers formed to surround the insulating pillar, wherein each of the channel layers includes an undoped channel area, an n-type doped buried channel area formed to surround the undoped channel area, and a p-type doped barrier area formed to surround the n-type doped buried channel area.

The n-type doped buried channel area may increase an on-current level of the vertical memory device and may decrease a pass voltage ($V_{pass}$) required during a word line read operation.

The p-type doped barrier area may induce Frenkel-Poole tunneling to increase a transferable distance of electrons.

A thickness of each of the channel layers may be equal to a sum of a thickness of the undoped channel area, a thickness of the n-type doped buried channel area, and a thickness of the p-type doped barrier area.

The thickness of the n-type doped buried channel area may be 5 nm to 8 nm.

The thickness of the p-type doped barrier area may be 3 nm to 5 nm.

The n-type doped buried channel area may be doped in a doping concentration of $1 \times 10^{19}$ atoms/cm$^3$.

The p-type doped barrier area may be doped in a doping concentration of $1 \times 10^{19}$ atoms/cm$^3$.

The first ion implantation may be performed using at least one n-type dopant of phosphorus (P), arsenic (As), antimony (Sb), and bismuth (Bi).

The second ion implantation may be performed using at least one p-type dopant of boron (B), aluminum (Al), indium (In), and gallium (Ga).

The channel layers may be formed through an epitaxial process.

Each of the channel layers may include at least one of polycrystalline silicon (poly-Si), polycrystalline silicon germanium (poly-SiGe), and epitaxial silicon (epi-Si).

Each of the charge storage elements may include a tunnel oxide film, a charge trap film, and a blocking insulating film.

The tunnel oxide film may include at least one of silicon oxides and metal oxides.

The charge trap film may include at least one of silicon nitrides and metal oxides.

The blocking insulating film may include at least one of silicon oxides and metal oxides.

In accordance with another aspect of the present invention, provided is a method of fabricating a vertical memory device, the method including a step of forming an insulating pillar on a substrate in a first direction perpendicular to the substrate; a step of forming channel layers to surround the insulating pillar; a step of forming a channel structure including the insulating pillar, an undoped channel area, an n-type doped buried channel area, and a p-type doped barrier area by performing first ion implantation on each of the channel layers to form the n-type doped buried channel area on a surface of each of the channel layers and performing second ion implantation on the n-type doped buried channel area to form the p-type doped barrier area on a surface of the n-type doped buried channel area; a step of forming a gate stack structure precursor including a plurality of sacrificial layers and a plurality of interlayer insulating layers alternately laminated in the first direction perpendicular to the substrate on the substrate on which the channel structure has been formed; a step of forming recesses by selectively removing the sacrificial layers; a step of forming charge storage elements in a second direction horizontal to the substrate so that the recesses are partially buried; and a step of forming gates in the second direction horizontal to the substrate so that the recesses are completely buried.

Advantageous Effects

According to an embodiment of the present invention, an n-type doped buried channel area and a p-type doped barrier area are formed by performing first ion implantation and second ion implantation on channel layers. Accordingly, the read threshold voltage ($V_{th,read}$) of a flash memory (NAND flash memory) can be reduced, thereby increasing power consumption efficiency. In addition, performance degradation by random telegraph noise (RTN) due to grain boundary traps, interface traps, and tunnel oxide traps can be minimized, thereby improving the reliability of a vertical memory device.

In addition, the first ion implantation is performed on the channel layers to form the n-type doped buried channel area, thereby increasing the on-current level of the vertical memory device and decreasing a pass voltage ($V_{pass}$) required during a word line read operation. Thereby, the power consumption efficiency of the vertical memory device can be improved.

In addition, the second ion implantation is performed on the channel layers to form the p-type doped barrier area. Thus, the transferable distance of electrons in traps is increased through Frenkel-Poole tunneling, which is the main conduction mechanism of random telegraph noise (RTN). Thereby, in the vertical memory device, effects due to traps can be reduced.

In addition, in the vertical memory device, the n-type doped buried channel area is formed to be embedded between the undoped channel area and the p-type doped barrier area, thereby minimizing degradation in device performance (e.g., low-current level or current fluctuation) due to grain boundary (GB) traps present in the channels.

In addition, in the vertical memory device, a buried channel (the n-type doped buried channel area) is formed by repeating an ion implantation process, thereby reducing traps (interface traps) generated by non-uniformity between the undoped channel area and the tunnel oxide film.

In addition, in the vertical memory device of the present invention, a channel structure in a multilayer form is formed. Thus, when a program/erase process is repeated, the effect of tunnel oxide traps generated in a tunnel oxide film can be reduced, and read failure due to random telegraph noise can be prevented, thereby improving the reliability of the vertical memory device.

BEST MODE

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Hereinafter, a vertical memory device according to an embodiment of the present invention will be described with reference to FIG. 1.

Figure 1:
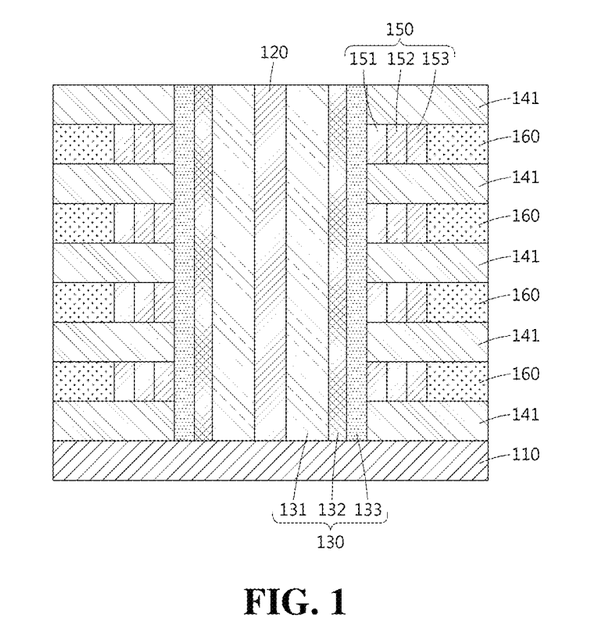
FIG. 1 is a cross-sectional view of a vertical memory device according to an embodiment of the present invention.

FIG. 1 is a cross-sectional view of a vertical memory device according to an embodiment of the present invention.

The vertical memory device according to an embodiment of the present invention includes a gate stack structure in which gates 160 and interlayer insulating layers 141 for insulating the gates 160 are alternately laminated on a substrate and multiple memory cell areas and inter-memory cell areas are divided in a first direction perpendicular to the substrate, a channel structure extending in the first direction from the substrate to penetrate the gate stack structure, and charge storage elements 150 disposed between the gate stack structure and the channel structure and sequentially formed to be embedded in the gate stack structure.

The channel structure includes an insulating pillar 120 formed at the center thereof and channel layers 130 formed to surround the insulating pillar 120. Each of the channel layers 130 includes an undoped channel area 131, an n-type doped buried channel area 132 formed to surround the undoped channel area 131, and a p-type doped barrier area 133 formed to surround the n-type doped buried channel area 132.

Accordingly, in the vertical memory device according to an embodiment of the present invention, the n-type doped buried channel area 132 and the p-type doped barrier area 133 are formed by performing first ion implantation and second ion implantation on the channel layers 130. Thus, the read threshold voltage ($V_{th,read}$) of a flash memory (NAND flash memory) may be reduced, thereby increasing power consumption efficiency. In addition, performance degradation by random telegraph noise (RTN) due to grain boundary traps, interface traps, and tunnel oxide traps may be minimized, thereby improving the reliability of the vertical memory device.

In addition, in the vertical memory device according to an embodiment of the present invention, a multilayer channel structure is formed. Thus, when a program/erase process is repeated, the effect of tunnel oxide traps generated in a tunnel oxide film may be reduced and read failure due to random telegraph noise may be prevented, thereby improving the reliability of the vertical memory device.

In the vertical memory device according to an embodiment of the present invention, the memory cell areas may be areas including the channel layers 130 and the charge storage elements 150 corresponding to each of the gates 160, and the inter-memory cell areas may be areas including the interlayer insulating layers 141 formed in parallel with the surfaces of the gates 160.

In addition, in the vertical memory device according to an embodiment of the present invention, source/drain areas may be formed on a substrate 110 by doping the substrate 110 with impurities.

Accordingly, in the vertical memory device according to an embodiment of the present invention, an impurity area serving as a common source line may be provided under the surface of the substrate 110. With this configuration, the lower portions of strings in which the channel layers 130 are formed may be connected to each other.

More specifically, in the vertical memory device according to an embodiment of the present invention, an impurity area serving as a common source line may be provided under the surface of the substrate 110. In addition, a conductive pattern may be formed on upper portions of the channel layers 130 (in a second direction: the direction perpendicular to the substrate), and the conductive pattern may serve as the drain junction area of the vertical memory device. In addition, the channel layers 130 adjacent to each of the gate electrodes 160 may serve as the channel of each memory cell.

In addition, the vertical memory device according to an embodiment of the present invention may include bit lines that contact the upper surfaces of the channel layers 130 and electrically connect the channel layers 130 arranged in the first direction (the direction parallel to the substrate) to each other.

In addition, in the vertical memory device according to an embodiment of the present invention, ground source line (GSL) and string select line (SSL) electrode gates provided with the interlayer insulating layers 141 and the gates 160 may be formed on each sidewall of the top and bottom of each of the channel layers 130. Accordingly, the string select line (SSL), which is an upper select transistor, may be provided between the bit line and the top memory cell (may be a cell transistor that stores memory), and the ground source line (GSL), which is a lower select transistor, may be provided between the substrate 110 and the bottom memory cell (may be a cell transistor that stores memory).

In addition, the vertical memory device according to an embodiment of the present invention may be formed in at least one of planar and cylindrical forms.

The vertical memory device according to an embodiment of the present invention may be a vertical NAND flash memory device (VNAND) having a vertical channel structure.

Accordingly, the vertical memory device according to an embodiment of the present invention may be used in a portable device using a flash memory such as universal serial bus (USB), a solid state drive (SSD), or a mobile phone.

Hereinafter, the vertical memory device according to an embodiment of the present invention will be described in more detail with reference to a method of fabricating a vertical memory device according to an embodiment of the present invention shown in FIGS. 2A to 2H.

FIGS. 2A to 2H are cross-sectional views for explaining a method of fabricating a vertical memory device according to an embodiment of the present invention.

Figure 2A:
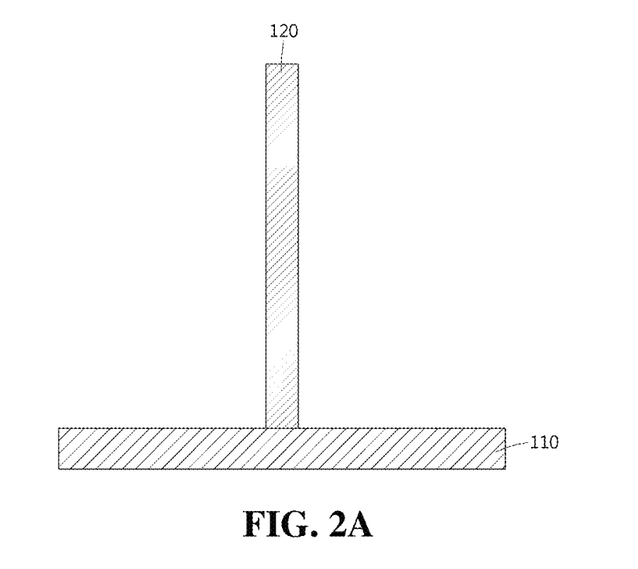
FIGS. 2A to 2H are cross-sectional views for explaining a method of fabricating a vertical memory device according to an embodiment of the present invention.

FIG. 2A is a cross-sectional view showing a substrate on which an insulating pillar is formed.

In the method of fabricating a vertical memory device according to an embodiment of the present invention, the insulating pillar 120 is formed on the substrate 110 in a first direction perpendicular to the substrate 110.

The substrate 110 may include a semiconductor substrate having constant conductivity. For example, the substrate 110 may include a group IV semiconductor, a group III-V compound semiconductor, or a group II-VI oxide semiconductor. For example, the group IV semiconductor may include any one of silicon, germanium, and silicon-germanium.

In addition, the substrate 110 may include any one of a single crystal silicon film, a silicon film formed on a silicon-on-insulator (SOI) or silicon germanium (SiGe) film, a silicon single crystal film formed on an insulating film, and a poly-silicon film formed on an insulating film.

In addition, the substrate 110 may be provided in the form of a bulk wafer layer or an epitaxial layer.

The insulating pillar 120 may be formed by forming a film for forming the insulating pillar 120 on the substrate 110, forming a photoresist pattern on the film for forming the insulating pillar 120, and then selectively etching, i.e., patterning, the film for forming the insulating pillar 120 using the photoresist pattern as a mask.

The insulating pillar 120 may include at least one of silicon oxides, undoped silica glass (USG), spin on glass (SOG), and Tonen SilaZene (TOSZ).

In addition, at least one insulating pillar 120 may be formed on the substrate 110.

Figure 2B:
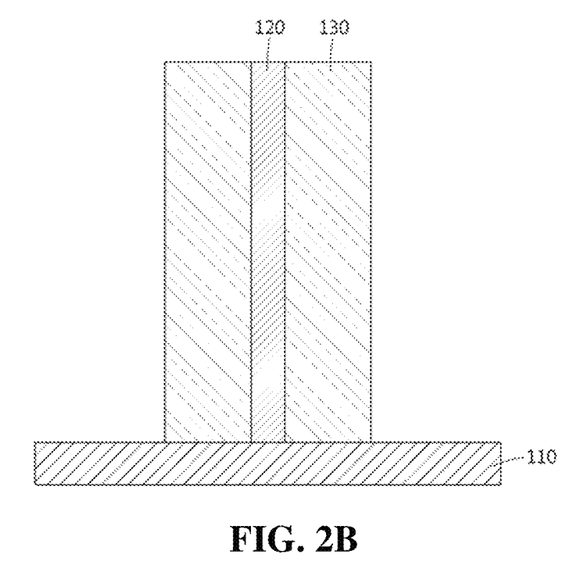

FIG. 2B is a cross-sectional view showing the substrate on which channel layers are formed.

In the method of fabricating a vertical memory device according to an embodiment of the present invention, the channel layers 130 are formed to surround the insulating pillar 120.

Since the channel layers 130 are formed using an undoped semiconductor material, the channel layers 130 may include an undoped channel area.

The channel layers 130 may be formed through an epitaxial process. Preferably, the channel layers 130 may be formed through a selective epitaxial growth (SEG) process using the top surface of the substrate 110 as a seed. In this case, the channel layers 130 may be formed to surround the surface of the insulating pillar 120.

The channel layer 130 may include at least one of polycrystalline silicon (poly-Si), polycrystalline silicon germanium (poly-SiGe), and epitaxial silicon (epi-Si).

Figure 2C:
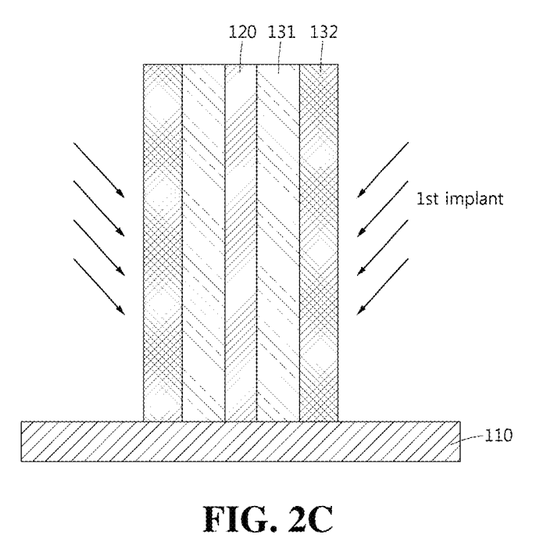
Figure 2D:
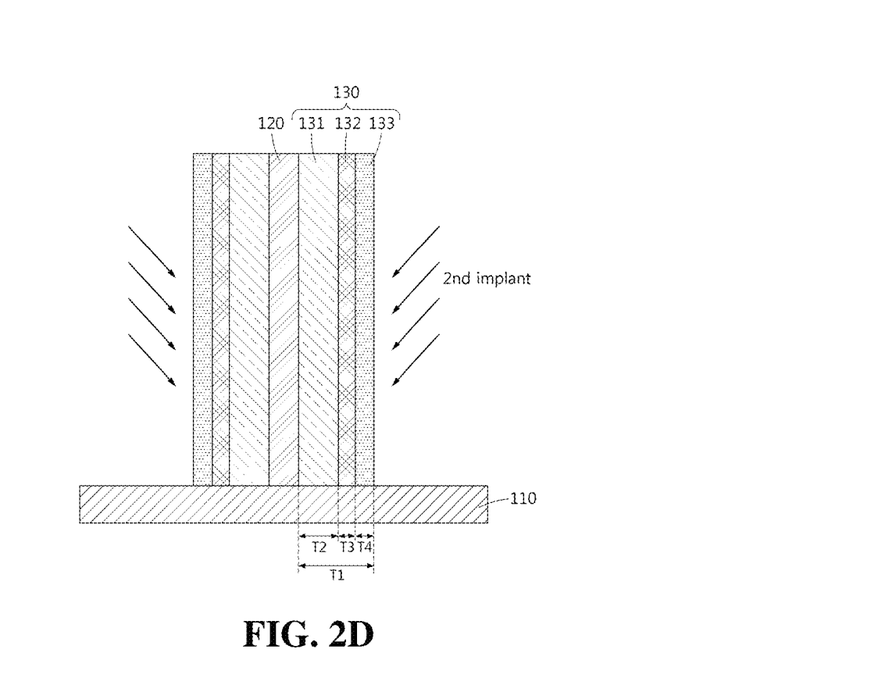

FIG. 2C is a cross-sectional view showing a process in which first ion implantation is performed on channel layers, and FIG. 2D is a cross-sectional view showing a process in which second ion implantation is performed on the channel layers.

In the method of fabricating a vertical memory device according to an embodiment of the present invention, the first ion implantation ($1^{st}$ implant) is performed on the channel layers 130 to form the n-type doped buried channel area 132 on the surface of each of the channel layers 130, and the second ion implantation ($2^{nd}$ implant) is performed on the n-type doped buried channel area 132 to form the p-type doped barrier area 133 on the surface of the n-type doped buried channel area 132.

Accordingly, each of the channel layers 130 may include the undoped channel area 131, the n-type doped buried channel area 132, and the p-type doped barrier area 133.

First, referring to FIG. 2C, the first ion implantation may be performed to form the n-type doped buried channel area 132 having a certain thickness on the surface of each of the channel layers 130.

Accordingly, in the method of fabricating a vertical memory device according to an embodiment of the present invention, first ion implantation may be performed on the channel layers 130 to form the n-type doped buried channel area 132, thereby increasing the on-current level of the vertical memory device and decreasing a pass voltage ($V_{pass}$) required during a word line read operation. Thereby, the power consumption efficiency of the vertical memory device may be improved.

The n-type doped buried channel area 132 may be doped in a doping concentration of $1\times10^{19}$ atoms/cm$^3$. When the doping concentration of the n-type doped buried channel area 132 is less than $1\times10^{19}$ atoms/cm$^3$, the on-current level of the vertical memory device may be increased, and a pass voltage ($V_{pass}$) required during a word line read operation may not be reduced. When the doping concentration of the n-type doped buried channel area 132 exceeds $1\times10^{19}$ atoms/cm$^3$, the channel layers 130 may be damaged.

The first ion implantation may be performed using at least one n-type dopant of phosphorus (P), arsenic (As), antimony (Sb), and bismuth (Bi).

Next, referring to FIG. 2D, the second ion implantation may be performed to form the p-type doped barrier area 133 having a certain thickness on the surface of the n-type doped buried channel area 132.

Accordingly, in the method of fabricating a vertical memory device according to an embodiment of the present invention, second ion implantation may be performed on the channel layers 130 to form the p-type doped barrier area 133. Thus, Frenkel-Poole tunneling, which is the main conduction mechanism of random telegraph noise (RTN), may be induced, thereby increasing the transferable distance of electrons in traps. Accordingly, a vertical memory device wherein effects due to traps are reduced may be fabricated.

The p-type doped barrier area 133 may be doped in a doping concentration of $1\times10^{19}$ atoms/cm$^3$. When the doping concentration of the p-type doped barrier area 133 is less than $1\times10^{19}$ atoms/cm$^3$, the transferable distance of electrons in traps may not be sufficiently increased. When the doping concentration of the p-type doped barrier area 133 exceeds $1\times10^{19}$ atoms/cm$^3$, the channel layers 130 may be damaged.

The second ion implantation may be performed using at least one p-type dopant of boron (B), aluminum (Al), indium (In), and gallium (Ga).

Accordingly, in the method of fabricating a vertical memory device according to an embodiment of the present invention, by performing the first ion implantation and the second ion implantation, the channel structure including the insulating pillar 120, the undoped channel area 131, the n-type doped buried channel area 132, and the p-type doped barrier area 133 may be formed.

The channel structure may include the insulating pillar 120 therein to reduce defects due to grains in channels.

A thickness T1 of each channel layer 130 may be equal to a sum of a thickness T2 of the undoped channel area 131, a thickness T3 of the n-type doped buried channel area 132, and a thickness T4 of the p-type doped barrier area 133.

Accordingly, according to the method of fabricating a vertical memory device according to an embodiment of the present invention, instead of repeatedly performing deposition and etching, ion implantation may be performed on the channel layers 131 formed in a single process to form the channel structure in a multilayer form. Accordingly, a process for forming a vertical memory device may be simplified.

The thickness T3 of the n-type doped buried channel area 132 may be 5 nm or more, and may be adjusted depending on criteria for the on-off operation of a device.

Preferably, when a vertical memory device having an on operation of $1\times10^{-5}$ A or more and an off operation of $1\times10^{-10}$ A or less is fabricated, the thickness T3 of the n-type doped buried channel area 132 may be 5 nm to 8 nm.

When the thickness T3 of the n-type doped buried channel area 132 is 5 nm or less, the device may not operate in an on-state due to too low an on-current level. When the thickness T3 of the n-type doped buried channel area 132 exceeds 8 nm, the device may be in a normally-on state, and thus may not operate in an off-state.

When a vertical memory device having an off operation of $1\times10^{-12}$ A or less is fabricated, the thickness T3 of the n-type doped buried channel area 132 may be 7 nm.

The thickness T4 of the p-type doped barrier area 133 may be 3 nm to 5 nm. When the thickness T4 of the p-type doped barrier area 133 is 3 nm or less, the effect of traps (no change in electron paths) may not be reduced due to the p-type doped barrier area 133 being too thin. When the thickness T4 of the p-type doped barrier area 133 exceeds 5 nm, Frenkel-Poole tunneling may not be induced due to the p-type doped barrier area 133 being too thick.

Accordingly, in the method of fabricating a vertical memory device according to an embodiment of the present invention, the n-type doped buried channel area 132 may be formed to be embedded between the undoped channel area 131 and the p-type doped barrier area 133, thereby minimizing degradation in device performance (e.g., low-current level or current fluctuation) due to grain boundary (GB) traps present in the channels.

In addition, in the method of fabricating a vertical memory device according to an embodiment of the present invention, a buried channel may be formed by repeating an ion implantation process, thereby reducing traps (interface traps) generated by non-uniformity between the undoped channel area 131 and the tunnel oxide film.

According to an embodiment, in the method of fabricating a vertical memory device according to an embodiment of the present invention, heat treatment may be performed to restore lattice damage in the undoped channel area 131 due to ion bombardment during the first ion implantation and the second ion implantation and to activate injected dopants.

For example, when the first ion implantation and the second ion implantation are performed, most dopants are present in gaps rather than in the lattice, and thus are not activated. Accordingly, heat treatment may be performed to activate the dopants.

That is, to restore lattice damage and activate dopants, heat treatment may be performed at a high temperature of 950° C. to 1,100° C. under a nitrogen or oxygen atmosphere. In this case, the heat treatment temperature may be lower than the melting temperature of the undoped channel area 131.

Figure 2E:
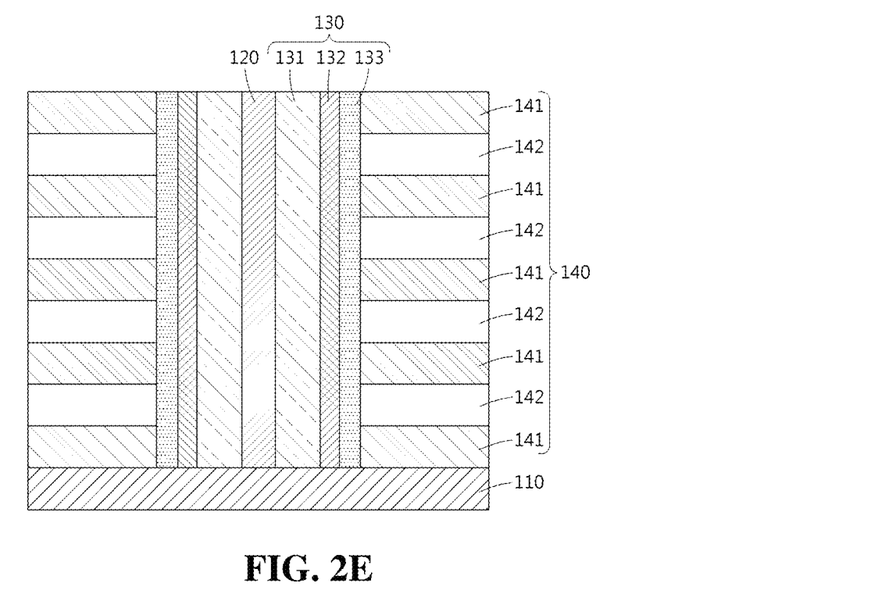

FIG. 2E is a cross-sectional view of a gate stack structure precursor formed around the channel layers.

In the method of fabricating a vertical memory device according to an embodiment of the present invention, a gate stack structure precursor 140 including a plurality of sacrificial layers 142 and the interlayer insulating layers 141 alternately laminated in the first direction perpendicular to the substrate 110 on the substrate 110 on which the channel structure has been formed is formed.

The gate stack structure precursor 140 may be formed to form memory strings including vertically laminated memory cells, and may have a large aspect ratio.

The sacrificial layers 142 may be formed to form the gates of memory cells or selection transistors, and the interlayer insulating layers 141 may be insulating films for insulating laminated gates from each other.

In this case, the sacrificial layers 142 may be formed of a material having a high etching selectivity with respect to the interlayer insulating layers 141. For example, the sacrificial layers 142 may be sacrificial films such as silicon nitride or silicon oxynitride films, and the interlayer insulating layers 141 may be insulating films including oxides. In addition, the sacrificial layers 142 may be conductive films such as polysilicon or tungsten films, and the interlayer insulating layers 141 may be insulating films such as oxide films.

When the sacrificial layers 142 and the interlayer insulating layers 141 are alternately laminated, the number of layers may vary, and various lamination methods, e.g., chemical vapor deposition, may be used.

Figure 2F:
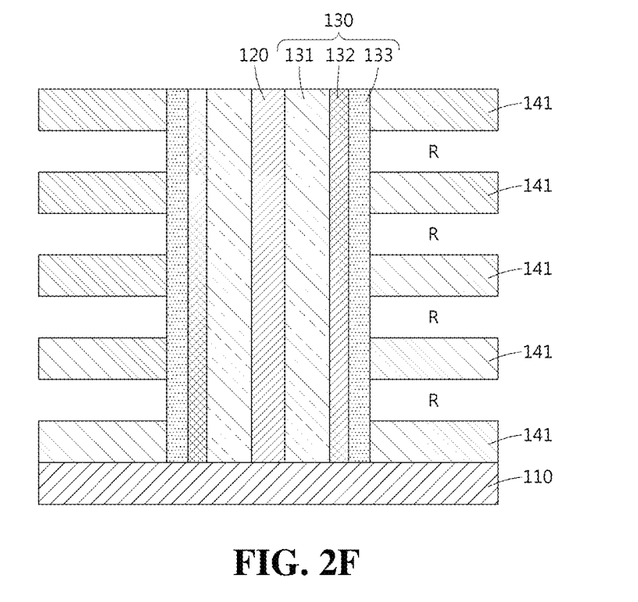

FIG. 2F is a cross-sectional view showing a gate stack structure precursor from which sacrificial layers have been removed.

In the method of fabricating a vertical memory device according to an embodiment of the present invention, the sacrificial layers 142 are selectively removed to form recesses R.

The sacrificial layers 142 may be selectively removed using an etching solution, and the removal process may be performed until the sides of the channel layers 130 are exposed.

In addition, by using a material having etching selectivity between the interlayer insulating layers 141 and the sacrificial layers 142, when the sacrificial layers 142 are etched, etching of the interlayer insulating layers 141 may be minimized, and only the sacrificial layers 142 may be selectively etched.

For example, when the sacrificial layers 142 are composed of silicon nitride or silicon oxynitride, wet etching using an aqueous phosphoric acid solution as an etching solution may be used to remove the sacrificial layers 142.

According to an embodiment, before the sacrificial layers 142 are removed or after the sacrificial layers 142 are removed (preferably, after a gate-forming process is performed), the interlayer insulating layers 141 may be removed by an etching process, and then may be replaced with a highly insulative material.

Figure 2G:
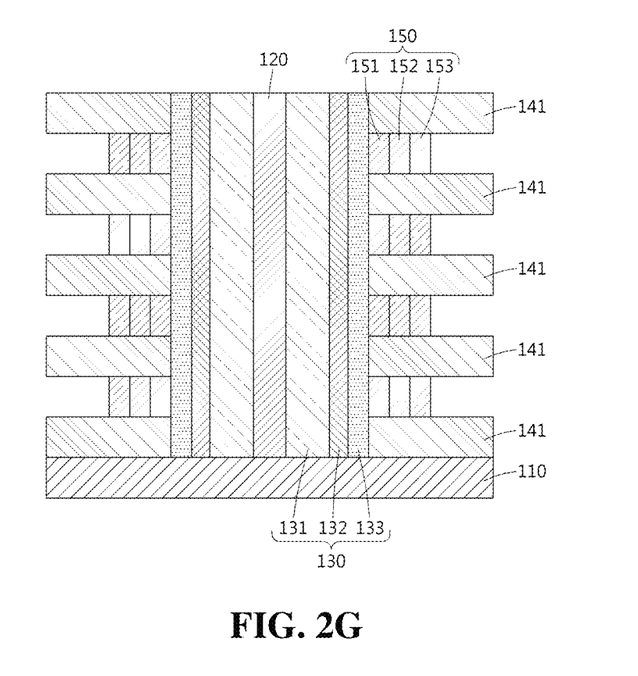

FIG. 2G is a cross-sectional view showing a gate stack structure in which charge storage elements are formed within recesses.

In the method of fabricating a vertical memory device according to an embodiment of the present invention, the charge storage elements 150 are formed in the second direction horizontal to the substrate 110 so that the recesses R are partially buried.

Each of the charge storage elements 150 may include a tunnel oxide film 151, a charge trap film 152, and a blocking insulating film 153. The tunnel oxide film 151 may be adjacent to the sidewall of the channel layer 130, the blocking insulating film 153 may be adjacent to the gate, and the charge trap film 152 may be interposed between the tunnel oxide film 151 and the blocking insulating film 153.

The charge storage element 150 may be formed by sequentially depositing or growing materials for forming the tunnel oxide film 151, the charge trap film 152, and the blocking insulating film 153 so that the recesses R are partially buried.

In addition, according to an embodiment, the tunnel oxide film 151 may be formed by a thermal oxidation process. When the tunnel oxide film 151 included in each memory cell transistor laminated in the vertical direction is formed of a thermal oxide film, the durability of the memory cell transistor may be improved.

The tunnel oxide film 151 may be a layer capable of tunneling charge to the charge trap film 152 in an F-N method, and may include at least one of silicon oxides and metal oxides.

For example, the tunnel oxide film 151 may include at least one of silicon oxide ($SiO_2$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxides (HfAlxOy), hafnium tantalum oxides (HfTaxOy), and hafnium silicates (HfSixOy).

The charge trap film 152 is a dielectric material having traps capable of storing charge, and may include at least one of silicon nitrides and metal oxides.

For example, the charge trap film 152 may include at least one of silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxides (HfAlxOy), hafnium tantalum oxides (HfTaxOy), hafnium silicates (HfSixOy), aluminum nitrides (AlxNy), and aluminum gallium nitrides (AlGa-xNy).

High dielectric constant (high-k) materials having higher dielectric constants than the tunnel oxide film 151 may be used as the blocking insulating film 153, and the blocking insulating film 153 may include at least one of silicon oxides and metal oxides.

For example, the blocking insulating film 153 may include at least one of silicon oxide ($SiO_2$), silicon oxynitride (SiON), and high dielectric constant (high-k) materials. The high dielectric constant (high-k) materials may include any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicates (ZrSixOy), hafnium oxide ($HfO_2$), hafnium silicates (HfSixOy), lanthanum oxide ($La_2O_3$), lanthanum aluminum oxides (LaAlxOy), lanthanum hafnium oxides (LaHfxOy), hafnium aluminum oxides (HfAlxOy), and praseodymium oxide ($Pr_2O_3$).

Preferably, the tunnel oxide film 151 may be silicon oxide ($SiO_2$), the charge trap film 152 may be silicon nitride ($Si_3N_4$), and the blocking insulating film 153 may have a oxide-nitride-oxide (ONO) structure, which is silicon oxide ($SiO_2$).

In addition, the tunnel oxide film 151, the charge trap film 152, and the blocking insulating film 153 may have a single-layer or multilayer form, respectively.

Figure 2H:
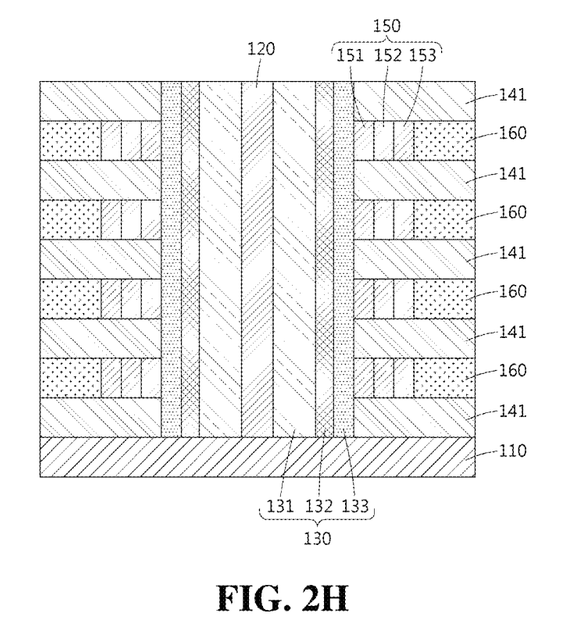

FIG. 2H is a cross-sectional view showing the vertical memory device according to an embodiment of the present invention fabricated according to the method of fabricating a vertical memory device according to an embodiment of the present invention.

In the method of fabricating a vertical memory device according to an embodiment of the present invention, the gates 160 are formed in the second direction horizontal to the substrate 110 so that the recesses R are completely buried.

For example, a film for forming the gates 160 may be formed by a deposition process such as an atomic layer deposition process or a chemical vapor deposition process.

In addition, the gates 160 may include at least one of low-resistance metals, such as doped silicon, tungsten, titanium, tantalum, and platinum, metal nitrides, metal silicides, and combinations thereof.

In addition, each of the gates 160 may be provided as the ground selection line (GSL) of a ground selection transistor (GST), and the gates 160 may be provided as the word lines of a plurality of memory cell areas (memory cells). In addition, the gate 160 formed on the uppermost portion may be provided as the string selection line (SSL) of a string selection transistor (SST).

Accordingly, in the vertical memory device according to an embodiment of the present invention, multiple gate stack structures in which the gates 160 and the interlayer insulating layers 141 are alternately laminated may be formed on the substrate 110 to be separated and spaced by the interlayer insulating layers 141.

Accordingly, the vertical memory device according to an embodiment of the present invention may include the channel structure disposed on the substrate 110 and a plurality of memory cells arranged along the sidewalls of the channel structure. The channel layers 130 may be used as the channels of the memory cells.

A plurality of memory cells may be arranged along the side of the channel structure disposed in a direction perpendicular to the substrate 110. In addition, memory cells extending in a direction parallel to the substrate 110 may be arranged along the side of the channel structure.

In the vertical memory device according to an embodiment of the present invention, the gates 160 may be connected in series with bit lines and source lines, and may be provided as the memory cell strings of the vertical memory device. One memory cell string may include a string selection transistor (SST), a ground selection transistor (GST), and a plurality of memory cells. The selection transistors (SST, GST) and the memory cells may be provided in one active structure.

In addition, one or more memory cell strings may be formed on the substrate 110, and each memory cell string may include two ground selection transistors, a plurality of memory cells, and two string selection transistors. According to an embodiment, one ground selection transistor and one string selection transistor may be provided.

Accordingly, the vertical memory device according to an embodiment of the present invention may be a channel buried three-dimensional flash memory device having low noise.

Comparative Example

Selective epitaxial growth (SEG) using dichlorosilane ($SiH_2Cl_2$) was allowed at a high temperature of 700° C. to form a polysilicon channel layer having a thickness of 20 nm.

Fabrication Example

Selective epitaxial growth (SEG) using dichlorosilane ($SiH_2Cl_2$) was allowed at a high temperature of 700° C. to form polysilicon having a thickness of 20 nm.

Then, ion implantation of phosphorus (P) was performed using an ion energy of 300 keV on the surface of poly silicon to form an n-type doped buried channel area, and ion implantation of boron (B) was performed using an ion energy of 150 keV on the surface of the n-type doped buried channel area to form a p-type doped barrier area. As a result, a channel layer in which an undoped channel area having a thickness of 10 nm, the n-type doped buried channel area having a thickness of 5 nm, and the p-type doped barrier area having a thickness of 4 nm were sequentially formed was formed.

When the ion implantation processes were performed, the n-type doped buried channel area was doped at a doping concentration of $1 \times 10^{19}$ atoms/cm$^3$ and the p-type doped barrier area was doped at a doping concentration of $1 \times 10^{19}$ atoms/cm$^3$.

Hereinafter, the characteristics of the vertical memory device according to an embodiment of the present invention will be described with reference to FIGS. 3A to 4.

Figure 3A:
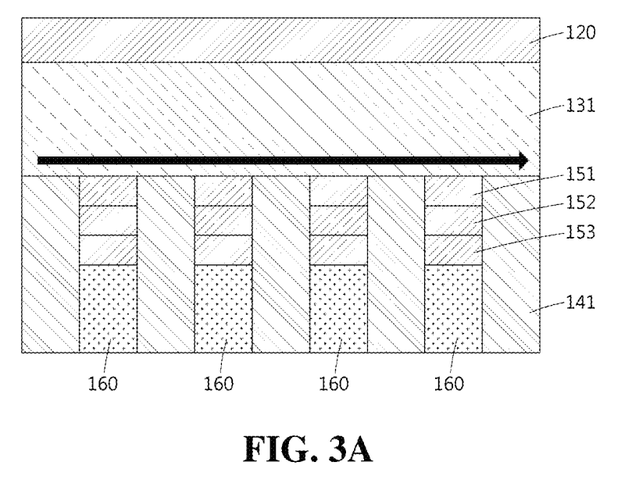
FIG. 3A is a conceptual diagram showing the percolation current path of a conventional vertical memory device.
Figure 3B:
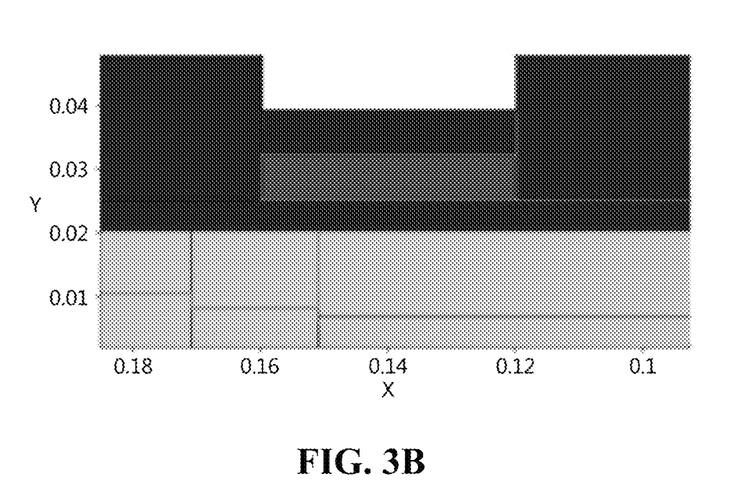
FIG. 3B shows a simulation of the percolation current path of a conventional vertical memory device.

FIG. 3A is a conceptual diagram showing the percolation current path of a conventional vertical memory device, and FIG. 3B shows a simulation of the percolation current path of a conventional vertical memory device.

Figure 3C:
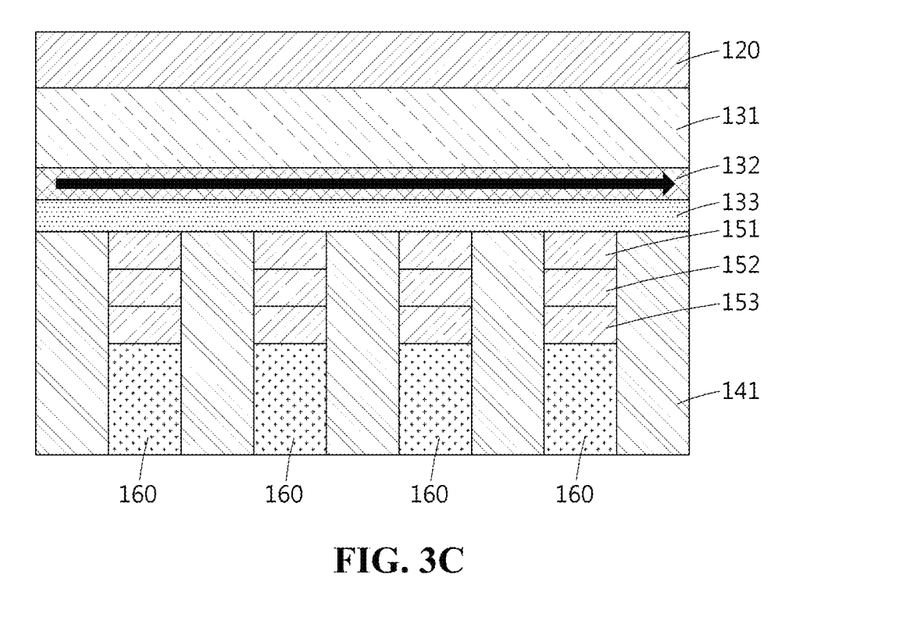
FIG. 3C is a conceptual diagram showing the percolation current path of a vertical memory device according to an embodiment of the present invention.
Figure 3D:
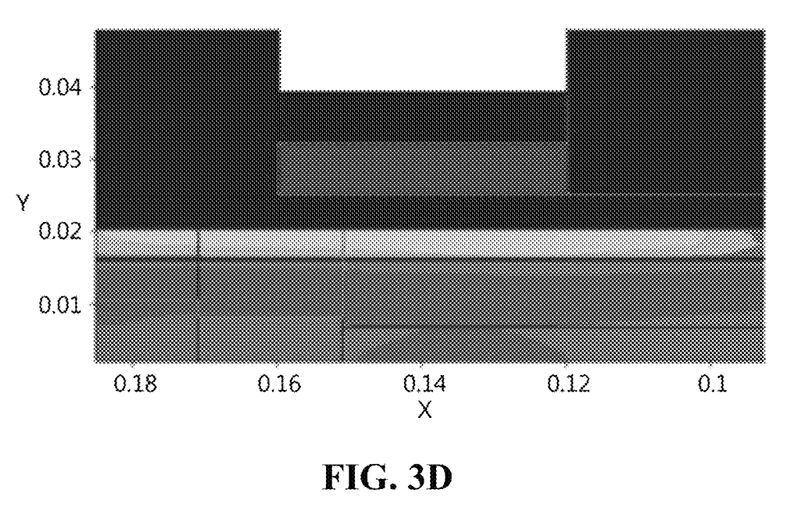
FIG. 3D shows a simulation of the percolation current path of a vertical memory device according to an embodiment of the present invention.

FIG. 3C is a conceptual diagram showing the percolation current path of a vertical memory device according to an embodiment of the present invention, and FIG. 3D shows a simulation of the percolation current path of a vertical memory device according to an embodiment of the present invention.

Referring to FIGS. 3A to 3D, since a conventional vertical memory device does not include an n-type doped buried channel area and a p-type doped barrier area, a percolation current path is formed in the lower portion of a polysilicon channel 131. In the case of the vertical memory device according to an embodiment of the present invention, a percolation current path is generated in an n-type doped polysilicon area (n-type doped buried channel area; 132) buried between a polysilicon area (undoped channel area; 131) and a p-type doped polysilicon area (p-type doped barrier area; 133).

Accordingly, it can be confirmed that, in the vertical memory device according to an embodiment of the present invention, when a program/erase process is repeated, the effect of tunnel oxide traps generated in the tunnel oxide film 151 is reduced, and read failure due to random telegraph noise is prevented.

Figure 4:
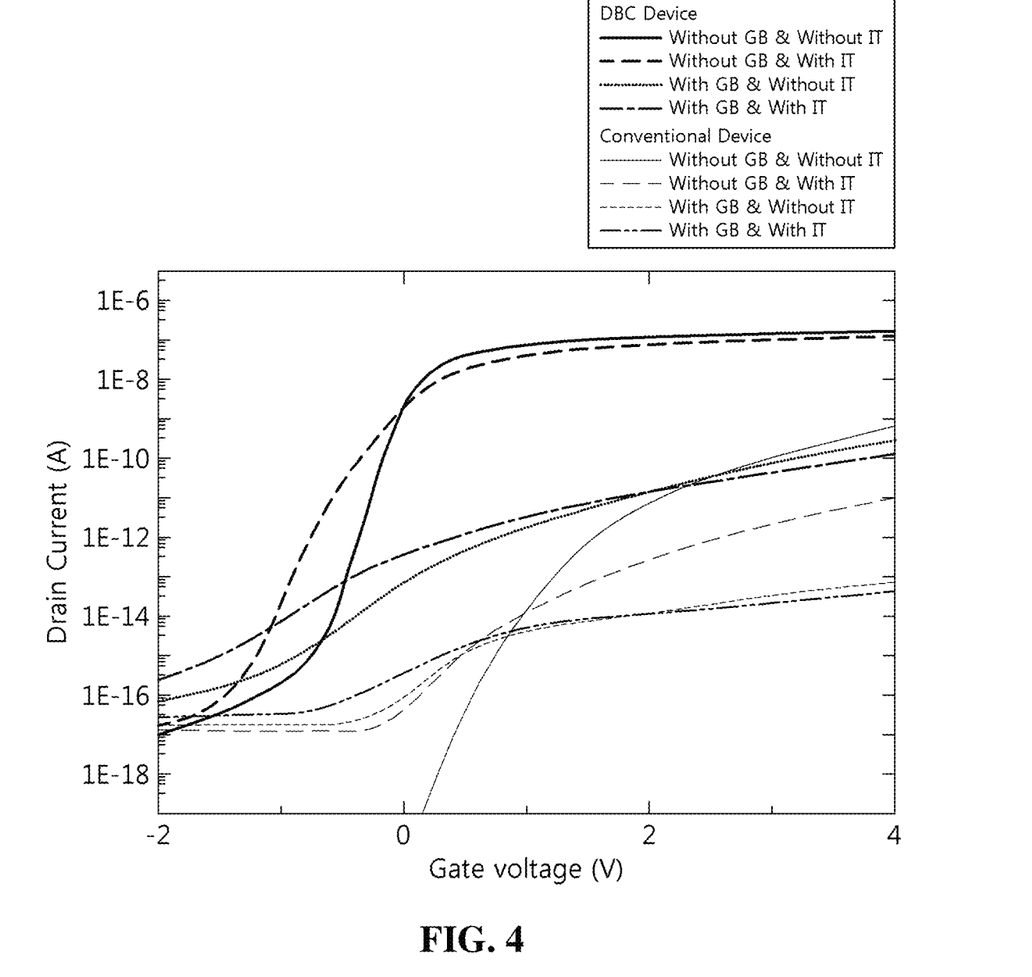
FIG. 4 is a graph showing the current-voltage (I-V) curves of a conventional vertical memory device and a vertical memory device according to an embodiment of the present invention.

FIG. 4 is a graph showing the current-voltage (I-V) curves of a conventional vertical memory device and a vertical memory device according to an embodiment of the present invention.

Referring to FIG. 4, in the vertical memory device (DBC Device) according to an embodiment of the present invention, an n-type doped buried channel area is formed to be embedded between an undoped channel area and a p-type doped barrier area, thereby minimizing degradation in device performance (e.g., low-current level or current fluctuation) due to grain boundary (GB) traps present in channels. Thus, it can be confirmed that, compared to a conventional vertical memory device (Conventional Device), the vertical memory device of the present invention has improved electrical properties and reliability.

Meanwhile, embodiments of the present invention disclosed in the present specification and drawings are only provided to aid in understanding of the present invention and the present invention is not limited to the embodiments. It will be apparent to those skilled in the art that various modifications can be made to the above-described exemplary embodiments of the present invention without departing from the spirit and scope of the invention.

The invention claimed is:

1. A vertical memory device, comprising:
   a gate stack structure in which gates and interlayer insulating layers for insulating the gates are alternately laminated on a substrate and multiple memory cell areas and inter-memory cell areas are divided in a first direction perpendicular to the substrate;
   a channel structure extending in the first direction from the substrate to penetrate the gate stack structure; and charge storage elements disposed between the gate stack structure and the channel structure and sequentially formed to be embedded in the gate stack structure, wherein the channel structure comprises an insulating pillar formed at a center thereof and channel layers formed to surround the insulating pillar, wherein each of the channel layers comprises an undoped channel area, an n-type doped buried channel area formed to surround the undoped channel area, and a p-type doped barrier area formed to surround the n-type doped buried channel area.

2. The vertical memory device according to claim 1, wherein the n-type doped buried channel area increases an on-current level of the vertical memory device and decreases a pass voltage ($V_{pass}$) required during a word line read operation.

3. The vertical memory device according to claim 1, wherein the p-type doped barrier area induces Frenkel-Poole tunneling to increase a transferable distance of electrons.

4. The vertical memory device according to claim 1, wherein a thickness of each of the channel layers is equal to a sum of a thickness of the undoped channel area, a thickness of the n-type doped buried channel area, and a thickness of the p-type doped barrier area.

5. The vertical memory device according to claim 1, wherein the thickness of the n-type doped buried channel area is 5 nm to 8 nm.

6. The vertical memory device according to claim 1, wherein the thickness of the p-type doped barrier area is 3 nm to 5 nm.

7. The vertical memory device according to claim 1, wherein the n-type doped buried channel area is doped in a doping concentration of $1 \times 10^{19}$ atoms/cm$^3$.

8. The vertical memory device according to claim 1, wherein the p-type doped barrier area is doped in a doping concentration of $1 \times 10^{19}$ atoms/cm$^3$.

9. The vertical memory device according to claim 1, wherein the first ion implantation is performed using at least one n-type dopant of phosphorus (P), arsenic (As), antimony (Sb), and bismuth (Bi).

10. The vertical memory device according to claim 1, wherein the second ion implantation is performed using at least one p-type dopant of boron (B), aluminum (Al), indium (In), and gallium (Ga).

11. The vertical memory device according to claim 1, wherein the channel layers are formed through an epitaxial process.

12. The vertical memory device according to claim 1, wherein each of the channel layers comprises at least one of polycrystalline silicon (poly-Si), polycrystalline silicon germanium (poly-SiGe), and epitaxial silicon (epi-Si).

13. The vertical memory device according to claim 1, wherein each of the charge storage elements comprises a tunnel oxide film, a charge trap film, and a blocking insulating film.

14. The vertical memory device according to claim 13, wherein the tunnel oxide film comprises at least one of silicon oxides and metal oxides.

15. The vertical memory device according to claim 13, wherein the charge trap film comprises at least one of silicon nitrides and metal oxides.

16. The vertical memory device according to claim 13, wherein the blocking insulating film comprises at least one of silicon oxides and metal oxides.

* * * * *